United States Patent [19]

Buller et al.

[11] Patent Number: 4,714,953
[45] Date of Patent: Dec. 22, 1987

[54] WELDED WIRE COOLING

[75] Inventors: Marvin L. Buller, Austin, Tex.; Douglas L. Lumbra, St. Albans, Vt.; Douglas W. Phelps, Burlington, Vt.; Sigvart J. Samuelsen, Burlington, Vt.; William C. Ward, Burlington, Vt.

[73] Assignee: International Business Machines Corporation, Armonk, N.Y.

[21] Appl. No.: 861,799

[22] Filed: May 12, 1986

[51] Int. Cl.[4] .................. H01L 23/34; H01L 23/36
[52] U.S. Cl. .............................. 357/81; 357/74; 357/80; 174/16 HS
[58] Field of Search .............. 357/74, 81, 80; 174/16 HS

[56] References Cited

U.S. PATENT DOCUMENTS 3,681,513  8/1972  Hargis ........................... 357/74

FOREIGN PATENT DOCUMENTS 56-7460    1/1981  Japan ........................ 357/81
58-200560 11/1983  Japan ........................ 357/81
59-944     1/1984  Japan ........................ 357/81

OTHER PUBLICATIONS

Cain & Ordonez, vol. 19, No. 5, Oct. 76, p. 1802 *IBM TDB* "Semiconductor Module with Improved Air Cooling".
Ciancanelli, vol. 19, No. 7, Dec. 76, p. 2652 *IBM TDB* "Circuit Module with Heat Transfer.

*Primary Examiner*—Andrew J. James
*Assistant Examiner*—Jerome Jackson
*Attorney, Agent, or Firm*—Andrea P. Bryant

[57] ABSTRACT

An improved thermal management technique is disclosed for use in semiconductor device packaging utilizing ultrasonic welding to attach aluminum wires of predetermined diameter at one end directly to preselected hot spots on the device and at the other end to thermally conductive package elements.

6 Claims, 4 Drawing Figures

WELDED WIRE COOLING

TECHNICAL FIELD

The present invention relates to thermal management in semiconductor devices. More particularly, it relates to a unique chip to cap heat conductive path for electronic components.

BACKGROUND ART

Techniques currently in use for dissipating heat from electronic modules include the use of radial finger cooling, pistons, and thermal grease. The option to place pistons, grease, or radial fingers for optimal cooling in the component package does not exist without extensive modification of the package structure. The same is true for other known methods including copper, wool, interlocking metal, filaments, dendrites, or the like.

U.S. Pat. No. 4,023,198 to Malone et al, discloses a semiconductor packaging configuration in which a heat sink is bonded to a semiconductor chip or die and a conductor is bonded to the die in a metalized ceramic insulating body for achieving optimum heat transfer. No weld or fusion is shown at the chip or heat sink and there is no lead connection to the heat sink. Selectively cooling chip areas is not taught by this reference.

IBM *Technical Disclosure Bulletin* to Buller et al, Vol. 28, No. 8, January 1986, page 3512, describes an improved heat sink for incorporation in semiconductor modules comprising a substrate on which are mounted semiconductor chips with a cover member seal thereover. Disposed within the cover and attached by welding to the inside of the top portion of the cover are a plurality of conductive brushlike members each of which is formed of a heat conducting resilient spring tempered wire. Multiple wires are used at each chip location. The wires are arranged such that they overlie one chip and are of sufficient length to resiliently engage the underlying chip. They are not bonded to the underlying chip however, and rely upon pressure force at the chip surface to make contact. The only control for wire contact location on the chip is through preforming the wires prior to assembly of the package.

U.S. Pat. No. 4,333,102 to Jester et al, discloses heat dissipating disk connected by brushlike bundles of wire soldered to the silicon disk at one end and heat dissipation disk at their other ends. Similarly, DE3031912 discloses wires bundled together and soldered to both the substrate and heat sink for heat conduction and DE2936816 discloses wires soldered to silicon devices for cooling.

DISCLOSURE OF THE INVENTION

The present invention provides improvements in thermal management in semiconductor packaging by providing a method of selectively metallurgically bonding fully annealed aluminum wire directly to both the back surface of a silicon chip and to a module cap for efficiently dissipating chip generated heat. Preferably, the aluminum wire is ultrasonically welded to the component chip and cap. The welded wires are placed in concentrations coinciding precisely with hot spots on the chip for creating a heat path directly from the area on the chip to the cooler portion of the package surface. Ultrasonic welding provides reliable intimate contact for maximum heat dissipation. Other features and advantages of the present invention will be more fully appreciated from the following detail description when taken in connection with the accompanying drawing wherein like reference characters designate like or corresponding parts throughout the several views.

BEST MODE FOR CARRYING OUT THE INVENTION

Figure 1:
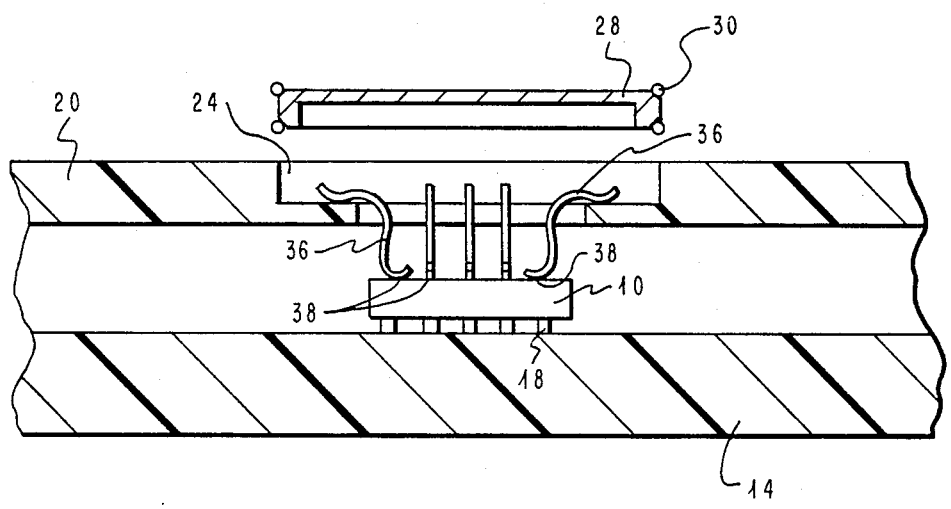
FIG. 1 is a cross-section view of a semiconductor chip package provided with welded wires for cooling.

FIG. 1 is a schematic illustration in cross-section of the packaging scheme of the present invention. Semiconductor chip 10 is attached to substrate 14 through bonding material 18 which may be C4. The package has an aluminum cap 20 which has an opening 24 formed therethrough. Closure cap 28 is provided to fill opening 24. Cap seal 30 is provided for assuring a complete closure.

A plurality of aluminum wires 36 are shown. One end of each wire 36 is bonded by ultrasonic welding to a predetermined location 38 on chip 10. The other end of each wire is bonded by ultrasonic welding to the substrate cap 20.

Each weld is accomplished ultrasonically to be a true metallurgical interconnection between the silicon chip, the soft and flexible aluminum wire and the cap or other hardware. There is thus provided a direct thermal path along each wire 36 from a particular source of heat 38 on chip 10 to an exterior surface. As shown the wires are welded to the package cap, but the connection may also be made to fins, strap or cold plate, as will be understood by those skilled in the art. The aluminum wires have a low mass and are fixedly attached.

Advantageously, the locations 38 on each chip may be chosen in an automated fashion, thereby providing the capability of welding a plurality of wires in concentrations coinciding precisely with hot spots 38. Thermal analysis techniques may be utilized to determine the exact location of the hot spots. Automatic wire bonders and thermal pattern recognition tools such as infrared thermal scanners may be coupled to provide the thermal analysis feedback information. The thermal information needs to be determined only once. Subsequently wire bonders may be controlled to utilize the same data.

The location of hot spots could also be defined by semiconductor engineers aware of where power is being dissipated or by predetermined device design groundrules. This information could be fed into an automated weld machine for assembly.

Figure 2:
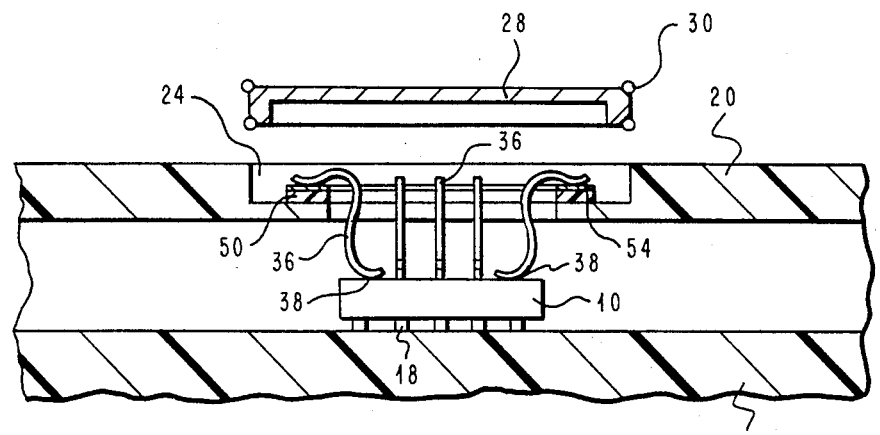
FIG. 2 is a cross-section view of a semiconductor chip package with welded wires and electrical isolation features.

FIG. 2 is a cross-section similar to that of FIG. 1 with the addition of means for providing electrical isolation. Conductive adhesive 50 is used to attach a ceramic washer 54 with a bondable top surface metalization 55 to aluminum cap 20. Wires 36 are bonded to the metalization 55 on the ceramic washer 54. The complexity of providing this feature is less than that associated with the prior art techniques of radial finger cooling and other methods, and is much less complex than pistons.

The technique described in connection with FIGS. 1 and 2 is applicable for various thicknesses and shapes of chips and caps. It provides total forgiveness for variations in dimensional properties such as chip tilt, chip to cap distance and other tolerances. Aluminum wire bonded chips for signal I/O are routine in the industry in hermetic packages, but are limited most often to smaller wire diameters due to the size of semiconductor pads which are desirably maintained as small as possible in order to reduce the amount of silicon required. Plastic dual inline packages frequently use gold wires for I/O contact, but these wires are not thermal paths in the same sense as the aluminum wires of the present invention.

Figures 3, 4:
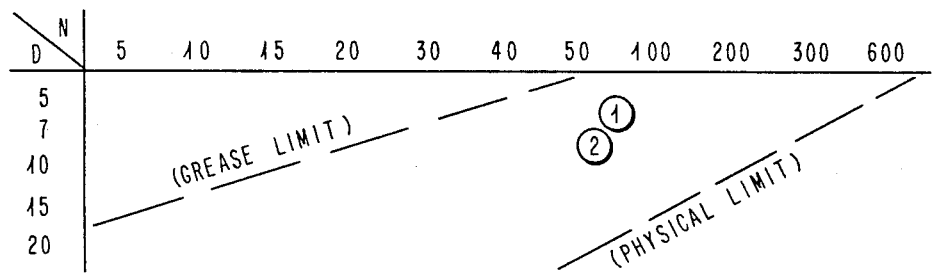
FIG. 3 is a graphic representation of the calculated affect on internal resistance of a chip package of various wire sizes.
FIG. 4 is graphic representation of actual internal resistance values.

FIG. 3 shows the calculated effect of using the present invention on internal resistance of the package. D represents wire diameter in mils; N, the number of wires in a bundle, that is, how many wires would be attached on chip 10. In FIG. 3 the mathematical analysis assumed a uniform heat surface on the chip and did not distinguish hot spots. The internal resistance at the package as measured from the chip surface to the cap surface is expressed in degrees centigrade per watt. The thermal characteristic of grease is taken as 5° C./W based on a 7.9 mm chip. The physical limit assumes a base weld of two times the diameter of the wire with welds covering 50% of the total chip surface area. The chip to cap distance is assumed to be 15 mils.

FIG. 4 illustrates the results of actual measurements superimposed on the calculated value chart shown in FIG. 3. A CFET thermal chip provided measured performance of welded wires with their associated physical characteristics. For two specimens evaluated the chip to cap distance was 0.010 inches. Specimen 1 consisted of 75 wires of 5 mil diameter. Specimen 2 consisted of 65 wires each having a diameter of 7 mils. The measured internal resistance for specimens fell well within the calculated range shown in FIG. 3. Specimen 1 $R_{int}$ was 6.1 and specimen 2 $R_{int}$ was 4.9° C./W.

Experimental data further confirm that the technique of simple program wire bonding using an appropriate cap design and wire quantity, diameter and location, is equivalent to or better than known alternatives. The implementation is simpler than grease or radial finger cooling at much reduced cost since it does not need a radical change in cap design nor is it sensitive to chip tilt and chip height. No stress is placed on the interconnections of the chip to the ceramic substrate. In addition, the disclosed technique does not have the end of life problems associated with thermal grease. Radial finger cooling on the other hand is sensitive to chip tilt and chip height and places a large amount of stress on chips causing breakage of the flip chip solder columns. Unlike prior art techniques using either grease or radial finger springs, the soft aluminum wires 36 of FIGS. 1 and 2 have no residual compressive force and require only 0.3 grams to deflect 20 mils with complete relaxation thereafter.

Refer to FIG. 3 for a comparison of the thermal efficiency of the cooling technique of the present invention to the conventional technique of thermal grease cooling.

Ultrasonic acoustic energy imparted to the chip and bonding material is not detrimental thereto. Samples made by this technique were cross-sectioned after wire attach and found to have no structural damage. These samples were also evaluated electrically both before and after wire attach step and found to experience no degradation in operational effects. 500 sample wires, 25 chips with 20 wires/chip, were assembled in accordance with the present invention and subjected to 340° C. thermal cycling with no loss in bond strength and having pull strengths not varying more than ±1 gram over all samples. Electrical tests on welded wire functional bi-polar static RAM chips have been successful. Thus, the present inventive technique, like all flip chip cooling enhancements, complements greatly the heat extracted by the flip chip solder balls themselves. However, flip chip balls are not positioned for cooling but rather are positioned for reliability and functional convenience as illustrated at 18 in FIGS. 1 and 2. Wires 36, however, are positioned for optimum cooling as above described.

Thus, it can be seen that the present invention possesses many advantages resulting from a true metallurgically interconnected thermal path formed by means of ultrasonic welding. Heat dissipation is more efficient because the aluminum wires are placed with their ends at hot spots on the chip as determined by sophisticated thermal analysis techniques and because the wires are fixedly attached to the chip and to other hardware in the package. This technique is not subject to degradation as a result of chip tilt, height thickness, or the distance between the chip and the cap.

As shown in FIG. 2 it is possible to use this cooling technique to achieve an electrically isolated environment by using commercially available insulating, thermally conductive adhesive between the top surface metalized ceramic washer to which the aluminum wires are bonded and the substrate cap. There is no stress induced in the chip from the ultrasonic welding as there may be when prior art cooling techniques are used. The bonded wires do not need to exert a pressure force on the chip in order to make contact In addition, the flexible wires used in the present invention do not induce thermal stresses caused by temperature excursions on materials with different coefficients of thermal expansion.

Some problems are associated with the use of thermal grease due to changes in material properties caused by aging, temperature cycling, or movement. Such problems are avoided with the present invention. Further, if the grease is not the right mixture for a particular package configuration, the silicon oil separates leaving a hard substance which, of course, does not function in the desired manner.

Chip power capabilities are extended as a function of the number and diameter of wires used as well as the location of the wires on the chip. The internal resistance of the module package is adjustable as a function of the number of wires used. The entire process may be easily automated using conventional equipment, which will be understood by those skilled in the art, using conventional automated wire bonding equipment with commercially available large diameter aluminum ultrasonic weld pattern recognition bonder equipment. The nature of the method of providing this cooling function is such that yield is not decreased as a result of the technique because there are fewer opportunities directly related to the cooling technique for damage to the chip from vibration, shock, or high temperatures.

While the invention has been described with reference to a preferred embodiment modification to form and detail may be made without departing from the scope of the invention.

What is claimed is:

1. A semiconductor packaging configuration comprising:
   a substrate;
   a semiconductor device mounted on the substrate;
   a cover attached to the substrate, overlying the semiconductor device; and
   a plurality of metallic filaments directly connecting preselected heat generating areas on semiconductor material in the semiconductor device to the cover, for dissipating heat generated in the semiconductor device.

2. The packaging configuration of claim 1 wherein the semiconductor device is mounted to the substrate with flip chip interconnection technology.

3. The packaging configuration of claims 1 or 2 wherein the metallic filaments are aluminum wires of predetermined diameter connected to the semiconductor device and to the cover by ultrasonic welding.

4. An electronic device package with improved thermal management characteristics, said package including a substrate, a cover attached thereto, and a silicon chip semiconductor device sandwiched therebetween, comprising:
   a plurality of aluminum wires in direct contact with a silicon portion of the semiconductor device chip at preselected heat generating areas fixedly attaching the semiconductor device to the cover for providing a path for dissipating heat from the semiconductor device.

5. The package of claim 4 additionally including means for electrically isolating the semiconductor device from the cover.

6. The package of claim 3 or 4 wherein the areas at which the plurality of aluminum filaments are attached to the semiconductor device are preselected as a function of the amount of heat generated thereat.

* * * * *